United States Patent [19]

Bouldin et al.

[11] 4,304,848

[45] Dec. 8, 1981

[54] METHOD FOR PHOTOGRAPHIC REPLICATION OF INFORMATION ON AN OPTICAL DATA STORAGE MEDIUM

[75] Inventors: Eric W. Bouldin, Woodside; Jerome Drexler, Los Altos Hills, both of Calif.

[73] Assignee: Drexler Technology Corporation, Mountain View, Calif.

[21] Appl. No.: 153,791

[22] Filed: Jun. 4, 1980

Related U.S. Application Data

[63] Continuation-in-part of Ser. No. 55,270, Jul. 6, 1979, Pat. No. 4,278,756.

[51] Int. Cl.³ .................... G03C 1/76; G03C 5/26; G03C 5/54; G01D 15/14
[52] U.S. Cl. .................... 430/401; 430/5; 430/8; 430/16; 430/21; 430/229; 430/231; 430/246; 430/396; 430/414; 430/416; 430/495; 430/945; 346/1.1; 346/76 L; 346/135.1; 358/6; 358/128.5; 358/130; 369/84; 369/100; 369/112; 369/121; 369/125; 369/153; 369/284; 369/288
[58] Field of Search .............. 430/416, 417, 414, 153, 430/1, 396, 16, 246, 231, 229, 945, 8, 5, 21, 401, 495; 346/1.1, 76 L, 135.1; 358/128.5, 128.7, 130, 6; 369/84, 100, 112, 121, 125, 153, 284, 285, 288

[56] References Cited

U.S. PATENT DOCUMENTS

| | | | |
|---|---|---|---|
| 3,464,822 | 9/1969 | Blake | 430/229 |
| 3,578,450 | 5/1971 | Miller et al. | 430/229 |
| 3,705,804 | 12/1972 | Farney et al. | 430/311 |
| 4,125,401 | 11/1978 | Spiertz et al. | 430/153 |
| 4,230,788 | 10/1980 | Spiertz et al. | 430/153 |
| 4,269,917 | 5/1981 | Drexler et al. | 430/16 |
| 4,278,756 | 7/1981 | Bouldin et al. | 430/414 |

OTHER PUBLICATIONS

Bartolini et al., "Review and Analysis of Optical Recording Media", *Optical Engineering*, vol. 15, No. 2, 3/1976, pp. 99–108.
Jerome et al., "Film-Based Videodisc System", Journal of the SMPTE, vol. 83, 7/1974, pp. 560–563.

*Primary Examiner*—Charles L. Bowers, Jr.

[57] ABSTRACT

A method of replicating data from a master transmissive optical data storage medium whereby the resulting product displays areas of low reflectivity and high reflectivity. Actinic radiation is shone through transmissive areas onto a silver-halide emulsion photosensitive medium. The photosensitive medium is then chemically developed black. Next, the developed medium is fogged to create a latent image layer of silver precipitating nuclei. Finally, the fogged medium is placed in a monobath comprising a weak silver-halide reducing agent and a rapid-acting silver-halide solvent for partial chemical development and substantial physical development. The resulting product displays areas of low reflectivity, which correspond to the transmissive areas of the master, in a reflective field.

16 Claims, 8 Drawing Figures

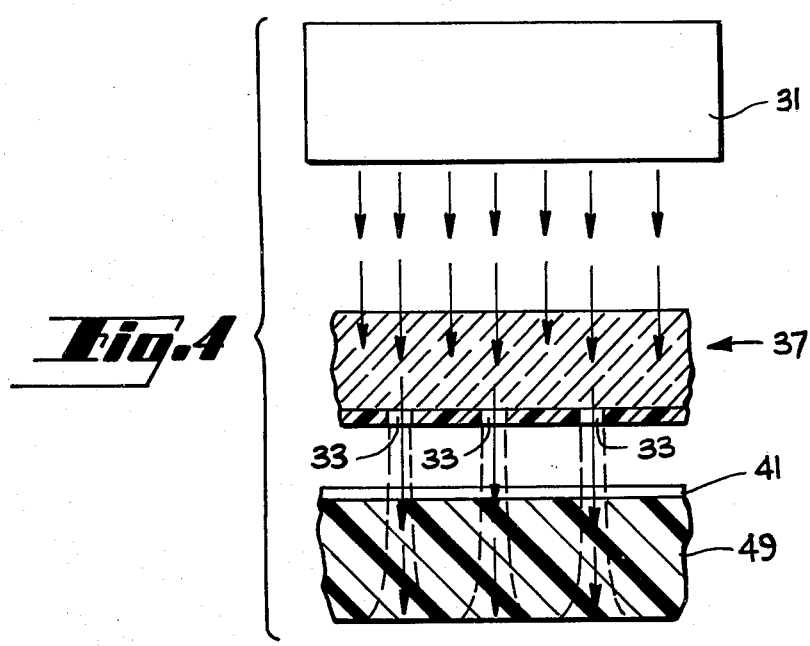
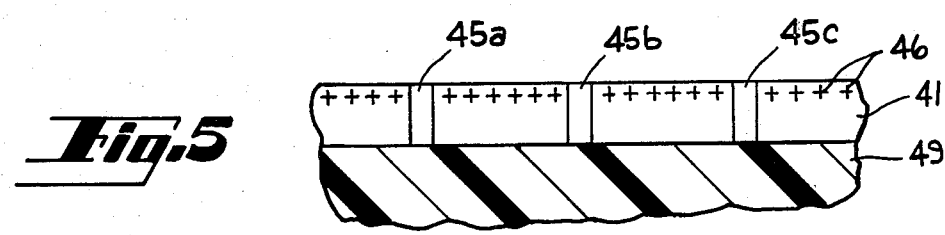
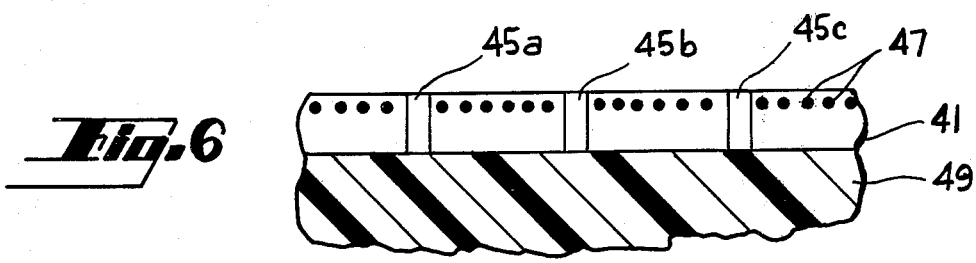
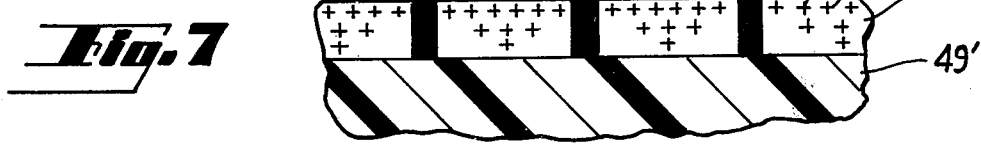
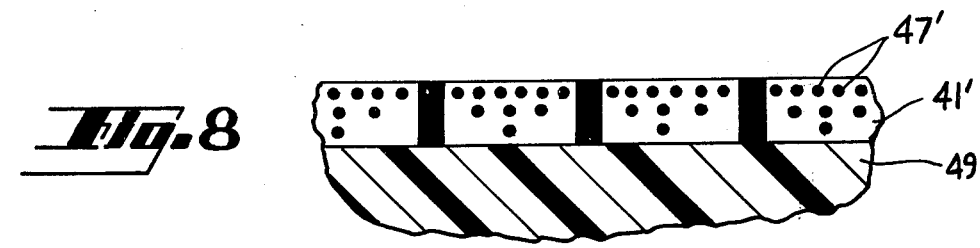

4,304,848

METHOD FOR PHOTOGRAPHIC REPLICATION OF INFORMATION ON AN OPTICAL DATA STORAGE MEDIUM

CROSS REFERENCE TO RELATED APPLICATION

This application is a continuation-in-part of application Ser. No. 55,270 by E. W. Bouldin and J. Drexler filed July 6, 1979, U.S. Pat. No. 4,278,756.

BACKGROUND OF THE INVENTION a. Field of the Invention.

The invention relates to the replication of information on a transmissive optical data storage media having information recorded by means of transparent areas in an opaque layer. In the present invention, the replicated information is copied onto a high resolution silver-halide emulsion which is made into a highly reflective optical data storage medium patterned with areas of low reflectivity.

b. Prior Art.

The fundamental principle behind optical data storage and indeed the fundamental principle behind data storage in general is the presence or absence of some signal. Where data storage is achieved optically, this signal may take the form of light transmission through the medium, reflection or scattering from the medium, or absorption by the medium, or any combination of these. Optical data storage media may contain data which is recorded directly on it with a laser beam, or it may contain data which was recorded on a master with a laser beam and then transferred onto replication media. The replication of optical data storage discs or video discs has been accomplished by several means, including pressing (like phonograph records), normal black and white silver-halide photography, diazo photography and photoresist-type photolithography.

Replicated optical data storage media are used for playback of analog or digital data. This media can take the form of circular discs which rotate under a laser beam, or rectangular plates which are scanned by a laser beam. Currently, the most common optical disc is the video disc used in the video playback system manufactured by Magnavox Corporation, a subsidiary of North American Philips. This disc stores information in the form of pits or depressions on a plastic disc which is coated with aluminum. A laser beam is used to read the rotating disc by detecting changes in phase of the reflected signal as the laser beam passes over the pits. The video disc copies are manufactured by injection molding or by a pressing process similar to that used in the manufacture of phonograph records. The copies have the same plastic bases as records. The mold used for making copies is produced by coating a polished glass disc with a thin metal coating which in turn is coated with photoresist. A laser beam exposes the photoresist with the video signal. After photographic development of the photoresist and etching of the thin metal coating, an electroforming process is usually used to build up the stamping mold. By this procedure, thousands of video disc copies may be produced from a master mold. After a disc copy is formed, it is coated with a thin layer of aluminum in a vacuum system. This disc copy is read by light which is reflected from the mirror-like aluminum surface. It cannot be read by transmitted light.

Another method of making copies from master video discs is to use photographic films or diazo copying films. Such a system has been developed by ARDEV, a subsidiary of Atlantic Richfield Corporation. In this system a master video disc is produced by exposing a rotating disc of unexposed photographic film to a modulated laser beam. The master is then photographically developed black so that light absorptive areas are formed by exposure to the laser. Then by contact printing, the master disc images are transferred to a diazo disc by actinic radiation throug the master disc. Finally, the diazo disc is photographically developed with ammonia fumes, and a copy is created. The diazo disc copy is read by transmitted light as opposed to light reflection as in the Magnavox system mentioned above. In transmissive read, a light source is focussed on the disc as it rotates and a photodetector on the opposite side of the disc detects light variations created by the images on the diazo disc passing in front of the light source. The diazo copy can be described as having been produced by photography. The diazo disc is not reflective and can only be read in transmission.

The same photographic master used to produce the diazo video disc copy could be used to produce a thin chromium optical disc by photolithography, similar to what is done to make chromium photomasks in the semiconductor industry. This process involves coating a substrate with a thin metal layer in a vacuum system, which in turn is coated with photoresist. The photographic master is placed in contact with the photoresist and actinic radiation is used to expose the photoresist through the photographic master, thus transferring the images to the photoresist. The photoresist is then developed so as to create small openings in the photoresist through which the metal coating is etched. After etching of the metal coating, the photoresist is stripped off leaving the etched metal replica of the master video disc. The replica can be read by reflecting light from its mirror-like surface or by transmitting light through it, provided that the substrate is transparent.

At the Symposium on Optical Data Display Processing and Storage which was sponsored by the Society of Photographic Scientists and Engineers, on Jan. 23 through 26, 1979, in Orlando, Fla., a paper was presented by D. G. Howe et al. disclosing a method of replicating a storage medium using contact printing. Specifically, the paper discloses the use of photo-activated dye or diazo-type systems to create light absorptive dots in the diazo which covers a mirror-like aluminized substrate. This disc can be read by reflected light but not by transmitted light.

Rice et al. found that contact prints of micron-sized images could be made without serious loss of resolution is care was taken to reduce reaction (Newton rings) at the emulsion interface (An Experimental Television Recording and Playback System Using Photographic Discs, Rice et al., J. SMPTE, Vol. 79, November 1970, page 997). This was done by employing a thin film of liquid within the approximate index of refraction between the two surfaces. The use of liquids in contact printing has been studied extensively. See: Printing Motion Picture Films Immersed in Liquid, Stoll et al., J. SMPTE, Vol. 66, Oct. 1957, page 607 and Printing Motion Picture Films Immersed in a Liquid: Evaluation of Liquids, Delwiche et al., J. SMPTE, Vol. 67, October 1958, page 678.

In patent application Ser. No. 55,270 Bouldin and Drexler disclose a photographic method for producing data images in a reflective recording and data storage medium. Contact and projection methods of exposure through a photomask are used in the semiconductor industry in the process of producing high resolution black silver emulsion photomasks. Such photomasks are squares five inches on a side and typically contain images of two microns and greater. In comparison, in the optical data storage industry the master and copying photosensitive medium are much larger is size, that is, approaching 12 inches in diameter and the images are smaller—that is, one micron or less. In this case conventional contact printing where the master is in direct contact with the copying photosensitive medium will no longer work owing to uncontrollable small air gaps between the master and the copying material. These gaps lead to inability to produce the smallest geometries and the creation of extraneous Newton ring images. Also, the continual contacting of the master with the copying material will eventually lead to damage of the master. Thus, it would be desirable to expose the copy media through a master without directly contacting it.

An object of the invention was to devise a simple and inexpensive method of creating reflective copies of transmissive master optical data recordings without the use of expensive evaporated or sputtered metal coatings. Another object of the invention was to devise a simple replication method that would create an optical data storage disc that could be read by reflected light or transmitted light without the use of vacuum deposition or metal etching methods. A further object was to devise a method of replicating transmissive optical or video discs onto a reflective high resolution replicating medium which is derived from commercially available high resolution silver-halide emulsions. A further object is to create reflective copies typically up to 12 inches in diameter containing data image one micron or less. A further object is to expose the silver-halide copying medium without directly contacting it with the master.

SUMMARY OF THE INVENTION

The above objects have been met by the discovery of a photographic method for replicating information from opaque video or digital data masters having light transmissive data areas onto media that become reflective copies. In accord with the method of the present invention, actinic radiation is directed through light transmissive areas in an opaque master optical data storage medium forming latent images in an unexposed photosensitive medium. This exposure may be carried out when the master and photosensitive medium are in direct contact or spaced apart. The photosensitive medium should be a fine grained black and white silver-halide emulsion with a major surface parallel to the master. The actinic radiation which traverses the transmissive areas in the master creates latent images in the silver-halide emulsion disposed immediately opposite the transmissive areas. The photosensitive medium is removed and photographically developed so that the latent images become gray or black spots. However, the developed medium is not chemically fixed since the remaining silver halide will be used in subsequent processing steps. These absorptive spots precisely correspond to the transmissive areas in the master.

The surface of the photosensitive medium is then activated to create a latent image layer of silver precipitating nuclei. This activation may be either by chemical fogging or by exposure to light. Next, the areawise partially developed and surface fogged or actinic radiation exposed silver-halide emulsion is dipped into a monobath containing a silver-halide solvent and a silver-halide developing agent which slightly chemically develops the latent image layer of precipitating nuclei. Simultaneously the silver-halide solvent in the monobath reacts rapidly with unexposed and undeveloped silver halide to form soluble complexed silver ions which are transported by diffusion transfer to the developing latent image layer of silver nuclei, where the silver in the complexed silver ions is precipitated on the partially chemically developed silver nuclei in the presence of the silver-halide developing agent acting as a reducing agent. The sizes of the silver nuclei are increased by this silver diffusion transfer or solution physical development step and since there is a high concentration of reflective non-filamentary silver particles, the surface takes on the appearance of high reflectivity. The adjacent black data areas remain gray or black. Since the exposure of the photosensitive medium through the transmissive master was a significant exposure and the chemical development which followed was essentially complete, there was negligible silver halide remaining in the gray or black regions. Thus, the latent image density of silver precipitating nuclei in the gray and black regions is low and there is little silver halide in these regions to create the silver ion complexes. Thus, these gray and black regions retain their low reflectivity. By these processes the transparent areas of the master disc correspond to the gray or black areas of the copy, which areas have reflectivities typically under 5%. The opaque areas of the master disc correspond to areas having reflectivities typically greater than 25% in the copy. Thus, the reflective contrast ratio of the master typically may exceed 5:1. The reflective surface is produced entirely by the silver contained within the silver halide of the emulsion of the photosensitive medium.

If it is desirable that the copy be read by transmitted light, the gray or black areas may be bleached by a standard silver bleach immediately after the initial chemical development step and before the surface fogging step. The resulting copy will have reflective and clear areas and could be read either in transmission or in reflection although the reflective contrast would not be as great as that of the previous case.

An advantage of the invention is that very high resolution reflective optical data storage copies of large diameter transmissive masters may be produced with commercially available silver-halide photosensitive materials disposed on glass or plastic substrates, which may be read either in reflection or transmission. An additional advantage is that physical wear of the master may be eliminated and data image quality improved by use of commercially available projection printing and off-contact exposure systems for copying smaller size masters, and data image quality and resolution may be improved for large and small size masters by printing through a non-aqueous liquid.

BRIEF DESCRIPTION OF THE DRAWINGS

FIG. 4 is a side sectional view illustrating a significant exposure in an alternate method of the present invention.

FIG. 5 is a side sectional view of the photographically developed, bleached and chemically surface fogged photosensitive medium in an alternative method of the present invention.

FIG. 6 is a side sectional view of the reflective copy produced in accord with an alternative method of the present invention.

FIG. 7 is a side sectional view of the photographically developed and deep penetration fogged photosensitive medium in an alternative method of the present invention.

FIG. 8 is a side sectional view of the reflective copy produced by deep penetration fogging in an alternative method of the present invention.

DESCRIPTION OF THE PREFERRED EMBODIMENT

The data replication method of the present invention comprises three sequential steps. First, an unexposed silver-halide emulsion is exposed through an opaque master and the exposed areas are developed black but not fixed. Next, the surface of the remaining silver-halide emulsion is fogged to create silver precipitating nuclei latent images. Finally, the now fogged medium is exposed to a monobath which slightly chemically develops the latent images and solubilizes silver halide into silver complexes and transports soluble silver complexes by diffusion transfer to the silver precipitating nuclei where the silver is reduced on the nuclei as in physical development so as to create a reflective silver surface region adjacent to a low reflectivity data area. By this process, low reflectivity data areas appear in a reflective field.

A. Patterning Exposure and Development

The first step in the method of the present invention is the exposure of a fine grain silver-halide emulsion photosensitive medium to actinic radiation through an opaque master which forms a pattern of latent images. As used herein, actinic radiation is the generic term which describes any exposure which creates a latent image in the photosensitive medium. Latent image is the term which describes activation of unexposed silver halide. An opaque master is an optical data storage medium, either original or manufactured copy, on which data is encoded by light transmissive areas, generally about one micron in size, in an opaque material. The opaque material may be disposed on a transparent supporting substrate, which is usually glass or plastic. The transmissive holes may be round or oval, depending on whether digital or analog data is recorded. The master may be a disc, but not necessarily so.

The silver-halide photosensitive medium which is exposed may be a commercially available black-and-white photoplate or black-and-white film product. The smaller the grain size of the silver-halide emulsion, the higher the resolution of the images on the final product which results from the application of this invention. The emulsion grain size should be less than 5% to 10% of the master hole size for best results. Commercially available high resolution silver-halide emulsion photoplates used in making semiconductor integrated circuits have grain sizes primarily under 0.05 microns and are suitable for the method of the present invention. The silver halide in such plates is held in a colloid matrix, normally gelatin; but the invention is by no means limited to such photoplates. Any fine grained silver-halide emulsion photosensitive medium may be used in the method of the present invention, for example, the medium may comprise a silver-halide emulsion covered by a thin transparent overcoat permeable to water.

Figure 1:
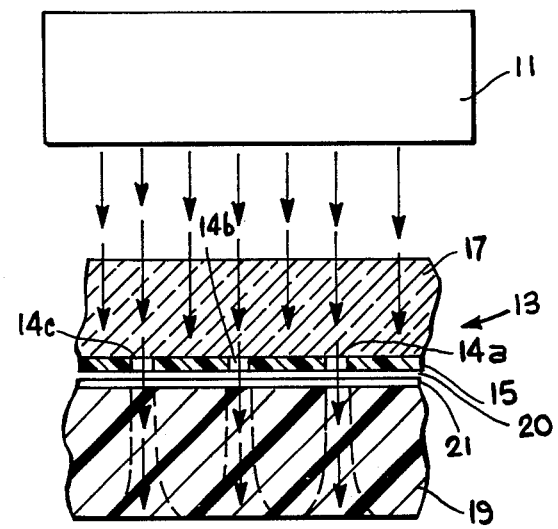
FIG. 1 is a side sectional view illustrating a significant exposure of a silver-halide emulsion on a plastic substrate in accord with the method of the present invention.

As shown in FIG. 1, a silver-halide emulsion 21 on a substrate 19, is placed immediately adjacent to the clear areas in the opaque master, 13. These holes are actual holes 14a, 14b, 14c through the opaque layer, 15, of the master. The opaque layer is disposed on some supporting substrate, 17, which is usually transparent glass or plastic.

The reflective copies may be produced from a master which is either in direct contact with the silver-halide photosensitive media or from a master which is separated from the photosensitive media. For small size masters and copies, say, 6 inches in diameter or less, and small numbers of copies, say, 100 or less, direct contact copying may be adequate for many applications. One principal disadvantage of this approach is that the multiple contacting of the master will lead to the physical wear and damage to the master, which will introduce data errors in the data storage disc copies.

For master discs up to 5 inches in diameter and data image sizes 1 micron or greater, a projection exposure system using reflective optics may be used to expose the silver-halide photosensitive medium to eliminate the physical wear and damage to the master. In this arrangement the master and copying media may be separated by several inches.

For master discs up to 5 inches in diameter and data image sizes 3 microns or greater, an off-contact or proximity printer may be used where the master and mask are separated by tens of microns. As noted, this arrangement is only satisfactory when larger data images are used.

When the master disc diameter falls between 5 inches to 12 inches and image sizes are in the range of one-half micron to several microns, another approach must be used to avoid excessive physical contacting of the master and to faithfully reproduce small data images. This is the use of a non-aqueous liquid between the master and the copying material, which has a reflective index of about 1.5 to reduce the need for high pressure contact between the master and copying material.

The method of this invention may be achieved by at least four known actinic radiation exposure methods. In direct contact printing the air between the master and the copying material is removed by pumping, causing the external air pressure to press the two surfaces together, creating an intimate contact. For masters up to 6 inches in size, there are commercial contact printers used in the semiconductor industry for making copies of master photomasks onto silver-halide emulsions of the type used to produce the reflective data storage media. Thus, this same apparatus can be used to produce reflective copies from transmissive masters. One such apparatus is the Ultratech CP210 printer.

When projection exposure of a disc copy up to 5 inches is desired with images of 1 micron or greater, it is possible to use the Perkin-Elmer Microalign 500 series projection mask aligner. This device can expose 125 five-inch disc copies per hour and has a resolution of 1 micron. The master and copy are separated by several inches, and reflective optics are used to project the master image onto the copying material. Although this machine is designed to expose photoresist-coated silicon wafers, it can also be used to expose silver-halide photosensitive media. The principal feature of this machine is the use of reflective optics to align the master in a plane parallel to the major surface of the silver-halide photosensitive media in a projection relationship to an alignment accuracy of one-quarter micron.

If the master contains images no smaller than 3 to 5 microns and is no larger than 5 inches, then commercially available off-contact or proximity printers may be used for copying the master. Such machines are manufactured by the Cobilt division of Computervision Corporation. These machines also incorporate the features of direct contact and soft contact as well as the off-contact or proximity printing mode. In this machine the master and copying media may be separated by tens of microns.

In another embodiment of the method of this invention, before the master and photosensitive medium are brought together, the transmissive surface of the master and the photosensitive surface of the photosensitive medium are coated with a non-aqueous liquid. This coating 20 is chosen primarily by refractive index so as to match the refractive index of the photosensitive emulsion so as to minimize multiple reflections between the master and photosensitive medium. Since the refractive index of gelatin at 20° C. is approximately 1.5, liquids having a refractive index at 20° C. close to 1.5 are preferred. The coating liquid should not react with or dissolve the supporting substrate subbing layer or the photosensitive emulsion. A useful characteristic is high volatility, so that when the photosensitive medium is separated from the master, the liquid rapidly evaporates. Trichloroethylene is the coating liquid of choice when applied to either photoplates or photographic films. Other coating liquids are listed below, but this is not an exhaustive list. Many liquids may be used to coat the master and the photosensitive medium; the choice between them is made on the criteria above: compatible refractive index and high volatility to minimize drying time.

TABLE 1

| POSSIBLE COATING LIQUIDS | |
|---|---|
| Refractive Index at 20° C. | Liquid |
| 1.461 | Carbon tetrachloride |
| 1.467 | Ethyl thioacetate |
| 1.475 | Decalin solvent |
| 1.478 | Trichloroethylene |
| 1.483 | 1,1,1,2-tetrachloroethane |
| 1.485 | Furfuryl alcohol |
| 1.489 | 1-bromo-2-chloroethane |
| 1.491 | Allyl sulfide |
| 1.494 | 1,1,2,2,-tetrachloroethane |
| 1.496 | Toluene |
| 1.501 | Benzene |

Once the surface of the opaque master and the emulsion surface of the photosensitive medium are coated with an appropriate liquid, they are brought into intimate contact. Any air bubbles which may have been formed in the coating layer should be removed. The presence of a thin coating layer, 20, between the master and photosensitive medium creates an almost constant refractive index zone. This means that actinic radiation from source 11 will not be reflected in the transition between the master and the photosensitive medium. The presence of the coating layer eliminates the formation of an interference pattern generally known as Newton rings. Newton rings are concentric rings, not usually perfect circles, produced when one plane surface is held in contact with another, by interference between directly transmitted light and that light being reflected back and forth between the layers imperfectly in contact.

The exposure, or the formation of latent images in the photosensitive medium, is a significant exposure. What is meant by significant exposure is that almost all of the silver halide grains in areas 23a, 23b and 23c are activated to form latent images which faithfully preserve the images of the master. Thus, those areas not exposed contain only unactivated silver halide, and the exposed areas contain primarily activated silver halide.

In order to eliminate the formation of spurious latent images, the photosensitive medium should only be exposed to actinic radiation during the exposure step. Thus, the exposure step must be done in the absence of actinic radiation or under photographic safe lights.

After exposure, the photosensitive medium is chemically developed but not fixed. Development converts the latent images formed in exposure to dark gray or black areas. The development procedure followed would be the normal one recommended by the manufacturer of the photosensitive emulsion. Again, development should be done in a light-free or safety-light environment. After development, the photosensitive medium is dried before proceeding to the next step for best results.

B. Surface Chemical Fogging

Figure 2:
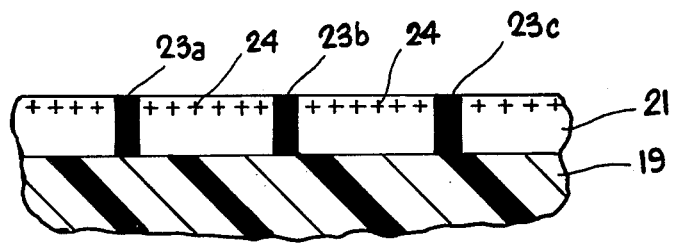
FIG. 2 is a side sectional view illustrating the photographic development step and chemical surface fogging of the photosensitive medium of FIG. 1 in accord with the method of the present invention.

With reference to FIGS. 2 and 5, after the silver-halide photosensitive medium has been exposed and developed, the medium is fogged. Fogging, or nucleation, is the process of creating silver precipitating nuclei as latent images in the remaining silver-halide emulsion. In the present invention, these latent image nuclei are formed primarily at the emulsion surface where the silver in silver ion complexes may be reduced to metallic silver forming a surface reflective layer. Some nuclei are located within the emulsion but are usually at a lower concentration than at the surface. Essentially, the fogging creates areas where transported silver complexes may be reduced to reflective silver. The latent image nuclei formed by fogging are indicated by the + signs in FIGS. 2, 5 and 7.

Photographic plates generally contain no overcoat or gelatin layer over the emulsion. Photographic films almost always do, and a somewhat different procedure is followed in each of these two cases. For the case of a photographic medium without an overcoat, the photosensitive emulsion layer 21 is penetrated slightly by the fogging agent to create a very thin surface layer of nuclei. Generally, silver-halide photosensitive material utilizes gelatin as a suspensive colloidal medium for the silver halide. Thus, to form a very thin layer of silver precipitating nuclei at the surface of the medium it is necessary to penetrate the gelatin only slightly. It is well known that when gelatin absorbs water, the gelatin swells, resulting in a rapid and deep penetration of any water based solution. However, for surface fogging we want only a slight penetration of the fogging agent. We have found that the use of a water miscible alcohol, an example of which is methanol, almost entirely eliminates swelling and deep penetration and thus yields a thin a highly dense latent image nuclei layer which after the following monobath development step may become the desired thin, highly reflective data recording medium.

If the photographic medium contains a thin gelatin overcoat as in the case of a photographic film, a greater penetration is required to reach the silver halide to form precipitating nuclei. Thus, in cases where the silver-halide emulsion is overcoated, a water based fogging agent may be more useful than a water miscible alcohol. When such water based fogging agents are used, the fogging time must be controlled so as not to deeply penetrate the photosensitive emulsion and create a thick, lower reflectivity surface coating.

The product which results from this invention has a very thin reflective silver surface layer, perhaps one micron or less. Areas of low reflectivity, formed by the prior exposure/development step, are surrounded by this reflective layer. This reflective silver surface is created by transporting silver ion complexes from the silver halide in the emulsion to the slightly developed silver precipitating nuclei in the surface layer and then reducing the silver complexes formed at these nuclei to reflective non-filamentary silver particles. It is clear that the most efficacious location for the silver precipitating nuclei is at the surface of the silver-halide emulsion.

For highest reflectivity it is desirable to limit the penetration of the fogging agent to as close to the surface of the photosensitive medium as is possible and practical. In this regard, methanol or any other water miscible alcohol is especially useful. However, any aqueous solution of a reducing agent will penetrate the gelatin of most commercially available photosensitive materials, thus creating a depthwise decreasing concentration of silver precipitating nuclei. Generally, in photography fogging agents are used in a bath and penetrate the entire medium. However, in the method of the present invention fogging time and the penetrability of the fogging solution are used to control the depth of penetration. It is important that the emulsion have a uniform dryness prior to emersion in the fogging agent in order to prevent varying degrees of penetration of the fogging agent.

A fogging agent is a very active reducing agent. Any one of the hundreds of photographic developers are reducing agents which could theoretically be made active enough to fog silver halide with the correct adjustments of concentration, pH and time. Borohydride is an example of a practical compound for the method of this invention, as it is very active in reducing silver halide, is not oxidized by air, and has no silver-halide solvent properties. Borohydrides of lithium, sodium, potassium, cesium and rubidium would be useful.

Consonant with the above limitation, depthwise penetration of the fogging agent is kept slight, primarily less than one micron. The competing factors of penetration and the duration of exposure to the fogging agent combine to determine the factors in the fogging step. By limiting depthwise penetration of the fogging or nucleation agent, the final reflective silver layer will occupy less than one micron with the silver most concentrated within the top 1/10 micron. The underlayer will contain some nuclei on which additional silver will deposit during the diffusion transfer process. Usually the thickness of the photosensitive emulsion medium is six microns or less.

The chemical surface fogging or nucleation step may be eliminated by incorporating a thin layer of nucleating agent on the surface of the silver-halide emulsion for silver precipitation. This is a common practice in silver diffusion transfer processes. In Chapter 16, "Diffusion Transfer and Monobaths," of *The Theory of the Photographic Process,* Fourth Edition, T. H. James, a number of types of effective nucleating materials are mentioned which have been incorporated into a silver precipitating layer including copper, silver, silver sulfide, selenium, cadmium sulfide, lead sulfide, and mercuric sulfide to produce a black silver. When a reflective surface is the objective rather than a black surface, it is important that round shaped crystals of silver are grown-not the filamentary type which leads to a black surface. Pure silver particles of a round-like shape would be preferred for this nucleating layer since sulfides tend to grow filamentary silver, which leads to a low reflectivity surface.

C. Silver Diffusion Transfer to Nuclei

After having formed a thin layer of silver precipitating nuclei latent images on the surface of the silver-halide photosensitive emulsion, the final steps of the method of the present invention entail a slight amount of photographic development of these latent image nuclei, then a transporting of the silver in the remaining silver halide to these developed silver precipitating nuclei by means of silver complexes there reducing the silver on the nuclei. This procedure is accomplished by placing the fogged media copy in a monobath. This monobath contain both a silver-halide solvent and a silver reducing agent. This step is also down in the dark or using a safe light until silver diffusion transfer is complete.

The two elements of this monobath, a silver-halide solvent and a silver reducing agent, comprise a chemical photographic developer and a silver diffusion transport and reduction system. The developing agent-solvent monobath performs several functions; it slightly develops and thus enlarges the silver nuclei of the latent images, dissolves the silver halide within the body, creates complexed silver ions and provides the reducing agent necessary for the solution physical development process, that is, the reduction and precipitation of the complexed silver ions on the silver precipitating nuclei of the developing latent image. The silver complexes are transported within the photosensitive emulsion to and through the surface of the emulsion. These silver complexes are then subjected to reduction, owing to the presence of the reducing agent, producing metallic silver on the silver nuclei. This is represented by the clustered dots in the reflective layer 27 of FIGS. 3, 6 and 8.

The complexed silver ions are created by reaction of an appropriate silver solvent and the unactivated silver halide in the emulsion. A developing or reducing agent must be included in this solution to permit the complexed silver ions to be precipitated on the nuclei layer. This combination of developing agent and silver complexing solvent in one solution is called a monobath solution. Preferred monobath formulations for highly reflective surfaces include a developing agent which may be characterized as having low activity. The specific type of developing agent selected appears to be less critical than the activity level as determined by developer concentration and pH.

The developing agent should have a redox potential sufficient for causing silver ion reduction and adsorption or agglomeration on silver precipitating nuclei. The concentration of the developing agent and the pH of the monobath should not cause filamentary silver growth which gives a black low reflectivity appearance. The developed silver particles should have a geometric shape, such as a spherical or hexagonal shape which when concentrated forms a highly reflective surface.

Developing agents having the preferred characteristics are well known in the art and almost any photographic developing agent can be made to work by selection of concentration, pH and silver complexing agent, such that there is no chemical reaction between the developing agent and complexing agent. It is well known that photographic developing agents require an antioxidant to preserve them. The following are typical developing agent/antioxidant combinations which may be used in conjunction with a sodium thiocyanate (NaSCN) solvent) complexing agent.

| For Monobaths Using Na(SCN) as a Solvent And Silver Complexing Agent | |
|---|---|
| Developing Agent | Antioxidant |
| p-methylaminophenol | Ascorbic Acid |
| p-methylaminophenol | Sulfite |
| Ascorbic Acid | ---- |
| p-Phenylenediamine | Ascorbic Acid |
| Hydroquinone | Sulfite |
| Catechol | Sulfite |

The preferred solvent/silver complexing agents, which must be compatible with the developing agent, are mixed therewith, in proportions promoting the complete diffusion transfer process within a reasonably short time, such as a few minutes. Such silver complexing agents in practical volume concentrations should be able to dissolve essentially all of the silver halide of a fine grain emulsion in just a few minutes. The solvent should not react with the developing silver grains to dissolve them or to form silver sulfide since this tends to create non-reflective silver. The solvent should be such that the specific rate of reduction of its silver complex at the silver precipitating nuclei layer is adequately fast even in the presence of developers of low activity, which are preferred to avoid the creation of low-reflectivity black filamentary silver in the initial development of the surface latent image.

The following chemicals act as silver-halide solvents and silver complexing agents in solution physical development. They are grouped approximately according to their rate of solution physical development; that is, the amount of silver deposited per unit time on precipitating nuclei, when used with a p-methylaminophenol-ascorbic acid developing agent.

Most Active

Thiocyanates (ammonium, potassium, sodium, etc.)
Thiosulphates (ammonium, potassium, sodium, etc)
Ammonium hydroxide

Moderately Active

αpicolinium-βphenylethyl bromide
Ethylenediamine
2-Aminophenol furane
n-Butylamine
2-Aminophenol thiophene
Isopropylamine

Much Less Active

Hydroxylamine sulfate
Potassium chloride
Potassium bromide
Triethylamine
Sodium sulfite From the above it can be seen that the thiocyanates and ammonium hydroxide are among the most active solvents/complexing agents. While almost all developers suitable for solution physical development can be made to work in the silver diffusion transfer process of the present invention with the proper concentration and pH, not all solvents/complexing agents will work within the desired short development time or in the proper manner. For example, the thiosulfate salts, the most common silver-halide solvent used in photography and in Polaroid-Land black and white instant photography's diffusion transfer process, does not work in the process for two reasons. Its complexed silver ions are so stable that it requires a strong reducing agent to precipitate the silver on the nuclei, and this strong reducing or developing agent would have the undesirable effect of developing low reflective black filamentary silver. It has another undesirable effect, also exhibited by the solvent thiourea; namely, that it forms black, low reflecting silver sulfide with the developing silver grains. On the other hand in the black and white Polaroid-Land process black silver is a desirable result. Sodium cyanide is not recommended, even though it is an excellent silver-halide solvent, because it is also an excellent solvent of metallic silver and would thus etch away the forming image. It is also about 50 times as toxic as sodium thiocyanate, which is a common photographic reagent.

In addition, if the solvent concentration is too low the solvent would not be able to convert the silver halide to a silver complex within a short process time and if the reducing agent is too weak the unexposed, undeveloped silver halide will bypass the silver precipitating nuclei causing much of the silver complex to go into solution rather than be precipitated. The process by which the silver complex is reduced at the silver precipitating nuclei and builds up the size of the nuclei is called solution physical development. Since p-phenylenediamine is both a chemical developing agent and a silver complexing agent, it may be used in a monobath to perform both roles.

It is important to note that in solution physical development, as used herein, the silver particles do not grow ultimately into filamentary silver as in direct or chemical development, but instead grow roughly equally in all directions, resulting in a developed image composed of compact, rounded particles. As the particles grow, a transition to a hexagonal form is often observed. If the emulsion being developed has an extremely high density of silver nuclei to build upon and there is sufficient silver-halide material to be dissolved, then eventually the spheres will grow until some contact other spheres forming aggregates of several spheres or hexagons. When chemical development is described as partial or slight as in the development of the latent images of precipitation nuclei it is meant that the chemical development has continued only to the point where the developing nuclei are roughly spherical or hexagonal. Complete chemical development leads to filamentary silver and gray or black areas.

After exposure to the monobath, the photosensitive medium is washed in water and dried. This halts the reduction of silver and stabilizes the photosensitive medium.

Since this diffusion transfer step only transports unactivated silver halide, those areas developed black in the first step of the present invention do not produce silver complexes. If too thick emulsions are used, the complexed silver entering the solution may be great, and reflective silver may be deposited over all areas, including the black areas. This is an undesired result since some images may be distorted or lost. The reflective areas form a background for the non-reflective spots. The desired product is an optical data storage medium having a background reflective field with small, low reflective spots encoding the recorded data. As an alternative procedure, by using a master with small opaque images the resulting product would have reflective spots in an opaque field.

D. Alternative Methods

In an alternative method of the present invention, essentially all of the above steps are followed and a new step added. The first step of the present alternative is illustrated in FIG. 4. A uniform source of actinic radiation, 31, exposes silver-halide emulsion 41 through holes 33 in the master, 37. The exposed areas are developed black, as shown in FIG. 2, but after development these areas are bleached to form clear areas 45 a, b and c using a standard photographic bleach. Thus where there is developed black silver in FIG. 2, FIG. 5 shows the absence of silver or activated silver halide in areas 45 a, b and c. Of course, the bleach only removes black filamentary silver without affecting the silver halide in the unexposed areas.

The remaining silver-halide emulsion is then fogged, as described above, creating silver precipitating nuclei on the surface of the photosensitive medium where unexposed silver halide remains. As is discussed above, the depth of penetration of the fogging agent is important. In cases where the photosensitive medium is overcoated, water or a water miscible alcohol may be preferred. Where the photosensitive medium is not overcoated, a fogging agent in methanol is preferred. In FIG. 5, the + signs indicate that nuclei are created only at the surface of emulsion 41.

After fogging, the emulsion is contacted with a monobath for a slight amount of chemical development followed by physical development. The silver halide is dissolved into soluble silver complexes which are transported to the silver precipitating nuclei. The soluble silver complexes are reduced at these nuclei to reflective silver to form a shiny reflective silver surface layer, as shown in FIG. 6 where black dots 47 represent shiny reflective silver particles. Since there is no silver halide in clear regions 45 a, b and c, none is transported to the surface and reduced since there are no silver nuclei in these regions. Thus these clear regions are only slightly reflected and are also transmissive to light. Thus this alternate method produces an optical data storage medium that can be read with reflective light or transmitted light.

Figure 3:
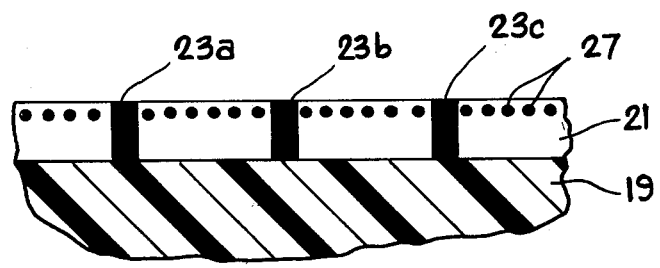
FIG. 3 is a side sectional view of the reflective copy produced in accord with the method of the present invention.

FIGS. 7 and 8 show alternative process methods compared to FIGS. 2 and 3. In FIGS. 7 and 8, the emulsion 41' is fogged as previously mentioned, but to a greater depth. This is accomplished by either actinic radiation or a penetrating fogging agent. The depth of penetration of the fogging extends through the emulsion, but with a depthwise gradient, with more latent image nuclei 46' at the upper surface of the emulsion and less in a downward direction. When actinic radiation is used it is preferred that at least 50% of the latent image nuclei are within 2 microns of the surface distal to the substrate. After fogging, the emulsion is contacted with a single monobath to accomplish partial chemical development and considerable physical development. As described previously, silver halide in the emulsion is made soluble and silver complexes are formed which are transported to the nuclei where silver is reduced and adsorbed onto the partially developed silver nuclei. This is illustrated in FIG. 8 where the + signs have been converted to black dots 47', the dots representing nuclei having silver particles. These black dots of FIG. 8 are actually shiny reflective particles with the greatest volume concentration at the upper surface and a lesser concentration extending in a downward direction. At the surface, aggregates of silver particles are also present.

EXAMPLE 1

This example illustrates the method of the present invention as applied to non-overcoated silver-halide emulsions. A $2\frac{1}{2}'' \times 2\frac{1}{2}''$ photoplate coated with a commercial Konishiroku ST emulsion, 3 microns thick, with an anti-halation backing and no screening dye, was exposed through a pattern containing serpentine, interdigitated one and two micron lines, on a Ultratech CP 210 printer for 5 seconds at 10.45 L/ft$^2$. The exposed photoplate was then developed for a period of 4 minutes in a developer comprising 7.9 gms hydroquinone, 36.9 gms sodium sulfite, 0.52 gms phenidone, 7.4 gms potassium hydroxide, 2.7 gms potassium bromide, 0.07 gms benzoltriazole with water added to bring volume up to 1 liter. The plate was removed from the developer bath and washed well and dried with a nitrogen stream.

After washing and drying, the developed photoplate was immersed in a fogging bath containing 0.5 gram $KBH_4$ and 0.6 gram $NaOCH_3$ with methanol added to bring volume up to one liter. Immersion lasted 30 seconds, after which the plate was washed well.

After washing, the photoplate was placed in a monobath developer for two minutes containing: 0.25 gram, Kodak Elon developer; 10 grams, sodium sulfite; 2 grams, NaOH; 2.5 grams, ascorbic acid; 50 grams, NaSCN; with water added to bring volume up to one liter. After development, the plate was removed from the monobath, washed well and dried.

The resulting copy of the pattern consisted of lines of low reflectivity and high reflectivity. If we call the low reflective image the pattern image and the high reflective image the field, the reflectivities achieved at different wavelengths were as follows:

|  | 633 nm | 780 nm | 830 nm |
| --- | --- | --- | --- |
| Field | 36% | 23% | 20% |
| Pattern Image | 3.4% | 2.9% | 2.1% |

The one micron lines in the pattern showed good resolution and contrast from top lighting in the copy. Note that the reflective contrast ratio is at least 8:1.

EXAMPLE 2

This example illustrates the method of the present invention as applied to an overcoated photosensitive film. A $2\frac{1}{2}'' \times 2\frac{1}{2}''$ sheet of Kodak SO-343 film was exposed through the same pattern as in Example 1 for 5.2 seconds at 10.15 L/ft². Following exposure, the film was developed for a period of 4 minutes in a developer comprising 7.9 gms hydroquinone, 36.9 gms sodium sulfite, 7.4 gms potassium hydroxide, 2.7 gms potassium bromide, 0.07 gms benzoltriazole with water added to bring volume up to 1 liter. The film was washed thoroughly and dried in an oven at 45° C. for 10 minutes.

The dried film was then fogged by immersion for 5 seconds in a solution containing 0.75 gram $KBH_4$ and 4 grams NaOH, with water added to bring volume up to one liter. Immediately after fogging, the film was immersed in a stop bath of 5% acetic acid for 30 seconds. Then the film was washed well and placed in a monobath developer for two minutes containing: 0.5 gram, Kodak Elon developer; 10 grams, sodium sulfite; 2.0 grams, sodium hydroxide; 10 grams, sodium thiocycanate; with water added to bring volume up to one liter.

After the partial chemical development and considerable physical development in the monobath was completed, the film was thoroughly washed and fixed. Again, low reflectivity of the pattern images in the copy and the high reflectivity in the surrounding field was as follows for the wavelengths shown:

|  | 633 nm | 830 nm |
|---|---|---|
| Field | 26% | 35.3% |
| Pattern Image | 3.9% | 3.5% |

This illustrates that there is at least a 6:1 field-to-image-reflectivity ratio. Thus the copy has a high reflective contrast ratio. The two micron images in the pattern showed good resolution.

What is claimed is:

1. A negative photographic process for replicating data from a master optical data storage medium, comprising,
   orienting a major surface of a fine-grained silver-halide emulsion photosensitive medium in a reference plane,
   aligning an opaque master optical data storage medium having lighttransmissive areas in a plane parallel to the major surface of the photosensitive medium, in a non-contacting projection relationship therewith,
   projecting actinic radiation through said light-transmissive areas of the master, thereby forming silver latent image areas in the photosensitive medium corresponding to said light-transmissive areas,
   chemically developing said silver latent image areas of the photosensitive medium, thereby forming dark, filamentary, low reflective silver areas corresponding to said light-transmissive areas of the master,
   forming an areawise layer of silver precipitating nuclei by chemical fogging or by exposure to actinic radiation at the major surface of the silver-halide emulsion in the unexposed and undeveloped region of the photosensitive emulsion,
   depositing nonfilamentary silver on said nuclei by silver diffusion transfer from said unexposed and undeveloped region, said silver particles being adsorbed on the nuclei, thereby forming an areawise high reflective field in areas corresponding to opaque areas of said master.

2. The method of claim 1 further defined by contacting said dark filamentary silver areas with a silver bleach prior to forming an areawise layer of silver precipitating nuclei.

3. The method of claim 1, wherein said nuclei layer is formed by an areawise exposure of a major surface of the photosensitive medium to actinic radiation, whereby a depthwise decreasing concentration of silver precipitating nuclei is formed.

4. The method of claim 1, wherein said nuclei layer is formed by chemically fogging the major surface of the photosensitive medium.

5. The method of claim 1 further defined by physically separating said opaque master from said silver-halide emulsion photosensitive medium a distance of greater than one inch.

6. The method of claim 1 further defined by physically separating said opaque master from said silver-halide emulsion photosensitive medium a distance of 0.01 inch or less.

7. The method of claim 1 further defined by placing said opaque master in contact with said silver-halide photosensitive emulsion through a liquid layer.

8. The method of claim 1 further defined by placing said opaque master in contact with said silver-halide emulsion.

9. A negative photographic process for replicating data from a master optical data storage medium, comprising,
   orienting a major surface of a fine-grained silver-halide emulsion photosensitive medium in a reference plane,
   aligning an opaque master optical data storage medium having light-transmissive areas in a plane parallel to the major surface of the photosensitive medium, in a non-contacting projection relationship therewith,
   projecting actinic radiation through said light-transmissive areas of the master, thereby forming silver latent areas in the photosensitive medium corresponding to said light-transmissive areas,
   chemically developing said silver latent image areas of the photosensitive medium, thereby forming dark filamentary, low reflective silver areas corresponding to said light-transmissive areas of the master,
   forming an areawise layer of silver precipitating nuclei at the major surface of the silver-halide emulsion in the unexposed and undeveloped region of the photosensitive emulsion,
   contacting said nuclei layer in the photosensitive medium with a reagent comprising a weak silver-halide developing agent for partial chemical development of said layer of silver precipitating nuclei and a rapid-acting silver-halide complexing solvent for reacting with unexposed and undeveloped silver-halide to form soluble silver ion complexes which are transported by diffusion transfer to said chemically developed nuclei where silver of said silver ion complexes is precipitated and adsorbed on said chemically developed nuclei in the presence of said developing agent acting as a reducing agent, thereby forming a high reflective, electrically nonconducting layer of aggregated and individual silver particles, the activity of solvent being sufficiently low to permit partial chemical development of said surface latent image by the weak developing agent before all of the undeveloped and unexposed silver-halide is dissolved where high reflective area is located in areas corresponding to opaque areas of said master.

10. The method of claim 9 further defined by contacting said dark filamentary silver areas with a silver bleach prior to forming an areawise layer of silver precipitating nuclei.

11. The method of claim 9, wherein said nuclei layer is formed by an areawise exposure of a major surface of the photosensitive medium to actinic radiation, whereby a depthwise decreasing concentration of silver precipitating nuclei is formed.

12. The method of claim 9, wherein said nuclei layer is formed by chemically fogging the major surface of the photosensitive medium.

13. The method of claim 9 further defined by physically separating said opaque master from said silver-halide photosensitive medium a distance of greater than one inch.

14. The method of claim 9 further defined by physically separating said opaque master from said silver-halide emulsion photosensitive medium a distance of 0.01 inch or less.

15. The method of claim 9 further defined by placing said opaque master in contact with said silver-halide photosensitive emulsion through a liquid layer.

16. The method of claim 9 further defined by placing said opaque master in contact with said silver-halide emulsion.

* * * * *